United States Patent
Yang et al.

(10) Patent No.: US 7,612,595 B2
(45) Date of Patent: Nov. 3, 2009

(54) SEQUENCE INDEPENDENT NON-OVERLAPPING DIGITAL SIGNAL GENERATOR WITH PROGRAMMABLE DELAY

(75) Inventors: Jungwook Yang, Newton, MA (US);
Lane Brooks, Highland, UT (US);
Pavan Mudunuru, Malden, MA (US)

(73) Assignee: Melexis Tessenderlo NV, Tessenderlo (BE)

( * ) Notice: Subject to any disclaimer, the term of this patent is extended or adjusted under 35 U.S.C. 154(b) by 80 days.

(21) Appl. No.: 11/856,301

(22) Filed: Sep. 17, 2007

(65) Prior Publication Data

US 2008/0224743 A1    Sep. 18, 2008

Related U.S. Application Data

(60) Provisional application No. 60/845,863, filed on Sep. 19, 2006.

(51) Int. Cl.
*H03K 5/13*    (2006.01)
(52) U.S. Cl. ........................... 327/239; 327/259
(58) Field of Classification Search ............... None
See application file for complete search history.

(56) References Cited

U.S. PATENT DOCUMENTS

| | | | |
|---|---|---|---|
| 3,961,269 A | 6/1976 | Alvarez, Jr. | |
| 4,417,158 A | 11/1983 | Ito et al. | |
| 4,494,021 A * | 1/1985 | Bell et al. | 327/262 |
| 4,816,700 A | 3/1989 | Imel | |
| 5,444,405 A | 8/1995 | Truong et al. | |
| 5,446,867 A * | 8/1995 | Young et al. | 713/503 |
| 5,453,707 A | 9/1995 | Hiratsuka et al. | |
| 5,532,633 A * | 7/1996 | Kawai | 327/174 |
| 5,652,535 A | 7/1997 | Kim et al. | |
| 5,796,360 A * | 8/1998 | Wendelrup | 341/143 |
| 5,955,906 A | 9/1999 | Yamaguchi | |
| 5,977,809 A * | 11/1999 | Wang et al. | 327/239 |
| 5,986,491 A | 11/1999 | Grehl et al. | |
| 6,005,507 A | 12/1999 | Nakatsu et al. | |
| 6,310,570 B1 | 10/2001 | Rumreich et al. | |
| 6,653,881 B2 * | 11/2003 | Truong et al. | 327/259 |
| 6,798,248 B2 | 9/2004 | Hazucha et al. | |
| 6,882,211 B2 * | 4/2005 | Kozaki | 327/407 |
| 6,900,682 B2 | 5/2005 | Truong et al. | |
| 6,909,311 B2 | 6/2005 | Foley et al. | |
| 7,199,665 B2 * | 4/2007 | Paillet et al. | 330/301 |

\* cited by examiner

*Primary Examiner*—Cassandra Cox
(74) *Attorney, Agent, or Firm*—Gauthier & Connors LLP

(57) ABSTRACT

A circuit for generating non-overlapping clock signals includes a programmable delayed reference clock signals circuit to produce a plurality of delayed reference clock signals and a plurality of delay clock signal generators, operatively connected to the programmable delayed reference clock signals circuit, to generate non-overlapping clock signals. Each delay clock signal generator includes a latch or flip-flop to control a delay in a rising edge of a clock signal and to output a first signal, another latch or flip-flop to control a delay in a falling edge of a delayed clock signal and to output a first signal, and a logic circuit to generate the clock signal from the first and second signals. The latches or flip-flops independently control a delay in the rising edge of the clock signal in response to one of the plurality of delayed reference clock signals.

20 Claims, 4 Drawing Sheets

SEQUENCE INDEPENDENT NON-OVERLAPPING DIGITAL SIGNAL GENERATOR WITH PROGRAMMABLE DELAY

PRIORITY INFORMATION

This application claims priority from U.S. Provisional Patent Application, Ser. No. 60/845,863, filed on Sep. 19, 2006. The entire content of U.S. Provisional Patent Application, 60/845,863, filed on Sep. 19, 2006, is hereby incorporated by reference.

BACKGROUND

Some conventional clock generator circuits include a pair of NOR circuits cross-coupled to each other, which serve as an R-S flip-flop. Such a conventional clock generator circuit generates two non-overlapping clock signals $\phi_1$ and $\phi_2$ opposite in phase to each other. In this conventional circuit, when an inverter is connected to the output terminal of each of the NOR circuits, two inverted clock signals of $\phi_1$ and $\phi_2$ are also obtained. Thus, the clock generator circuit associated with such inverters generates two pairs of clock signals ($\phi_1$ and $\phi_2$ and inverted clock signals of $\phi_1$ and $\phi_2$). To extend this two phase non-overlapping clock generator with more phases of clock signals, this circuit can be cascaded to accept multiple signals accordingly.

However, in the above-mentioned circuit, the sequence of the clock signals are hardwired and cannot be reconfigured without re-routing the wires unless there are multiplexers introduced in the signal path as illustrated in FIG. 2. Also, due to fluctuation in manufacture, the delay time of each of the inverters is fluctuated. At worst, this delay time is so long that the clock signal $\phi_1$ may be overlapped with the clock signal $\phi_2$.

In another conventional clock generator circuit, a clock input is provided to a level shifter and clock buffer. The output of the buffer is provided to a divide-by-two circuit, which divides the frequency of clock down to a rising-edge clock level and a falling-edge clock level. These clock levels are input to a clock driver that generates clock signals $\phi_1$ and $\phi_2$. However, this conventional clock generator circuit has the fixed sequence when it is extended to more than two phases of clock signals. Also, it suffers from clock delay due to the buffering and intermediate logic.

One implementation of these conventional clock generator circuits is in an analog-to-digital converter circuit. For example, a conventional analog-to-digital converter circuit may include a clock generator circuit having fixed timing sequences and utilizing a four phase signal generator. In this clock generator circuit, two pairs of clock signals are generated by using a reference clock signal. Moreover, this conventional clock generator circuit generates a pair of clock signals that are opposite in phase to each other and which do not overlapped with another pair of clock signals opposite in phase to each other. Another possible implementation is using a cascaded multi-phase non-overlapping clock generator, but it does not allow the changing of the sequence of the clock signals unless there is a reconfigurable signal path as explained below.

FIG. 2 illustrates a prior art circuit and method of generating non-overlapping clock signals with reference to other signals that can generate multi-phase non-overlapping signal generator with n number of (n−1)→1 multiplexers and has a delay cell for each signal generator. As illustrated in FIG. 2, each multiplexer (210, 240, 270) receives n−1 phase signals out of the n phase signals (ph1 through ph(n)) to make the reconfigurable clock signal path to allow reconfigurable clock sequence.

As further illustrated in FIG. 2, multiplexer 210 selects one of the signals (ph2 through ph(n)) based upon received selection signals ($C_1$-$C_M$); multiplexer 240 selects one of the signals (ph1 and ph3 through ph(n)) based upon received selection signals ($C_1$-$C_M$); and multiplexer 270 selects one of the signals (ph1 through ph(n−1)) based upon received selection signals ($C_1$-$C_M$). Thus, each multiplexer receives a subset of the n phase signals (ph1 through ph(n)).

The selected signal is input to a NOR circuit (220, 250, 280). For example, the selected signal from multiplexer 210 is input to a NOR circuit 220; the selected signal from multiplexer 240 is input to a NOR circuit 250; and the selected signal from multiplexer 270 is input to a NOR circuit 280.

The selected signals are NOR'ed with an input signal (In1, In2, ..., In(n)). For example, the selected signal from multiplexer 210 is NOR'ed with input signal In1; the selected signal from multiplexer 240 is NOR'ed with input signal In2; and the selected signal from multiplexer 270 is NOR'ed with input signal In(n). To generate the proper delay, the NOR'ed signals are input to a delay cell (230, 260, 290) with gate delays.

The prior art circuit of FIG. 2 generates non-overlapping signals, which are dependent upon other signals. More specifically, the prior art circuit of FIG. 2 generates non-overlapping signals, which are dependent upon the delay cells between the input signal (In1, In2, ..., In(n)) path and output clock signals (ph1 through ph(n)).

Moreover, the prior art circuit of FIG. 2 may require large area overhead from the multiplexers and also the replica delays for each signal to accommodate any changes in the sequence of the clock signals. Lastly, the prior art circuit of FIG. 2 cannot generate non-overlapping signals wherein the delays in the rising and falling edges of the signals are independent of each other.

Therefore, it is desirable to provide a clock generation circuit which generates non-overlapping signals. Moreover, it is desirable to provide a clock generation circuit which generates non-overlapping signals that are not dependent upon other signals. Also, it is desirable to provide a clock generation circuit which generates non-overlapping signals without utilizing a large area of the chip. Lastly, it is desirable to provide a clock generation circuit which generates non-overlapping signals wherein the delays in the rising and falling edges of the signals are independent of each other.

BRIEF DESCRIPTION OF THE DRAWINGS

The drawings are only for purposes of illustrating preferred embodiments and are not to be construed as limiting, wherein.

DETAILED DESCRIPTION

Figure 1:
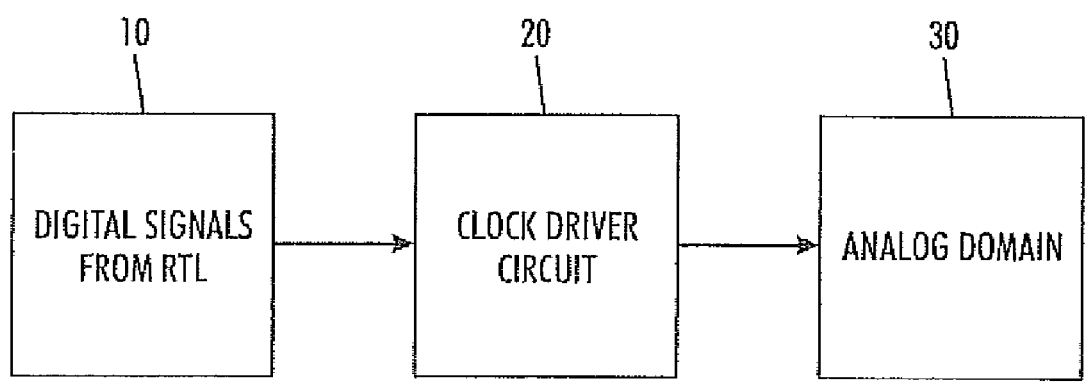
FIG. 1 illustrates a system utilizing a clock driver circuit.
Figure 2:
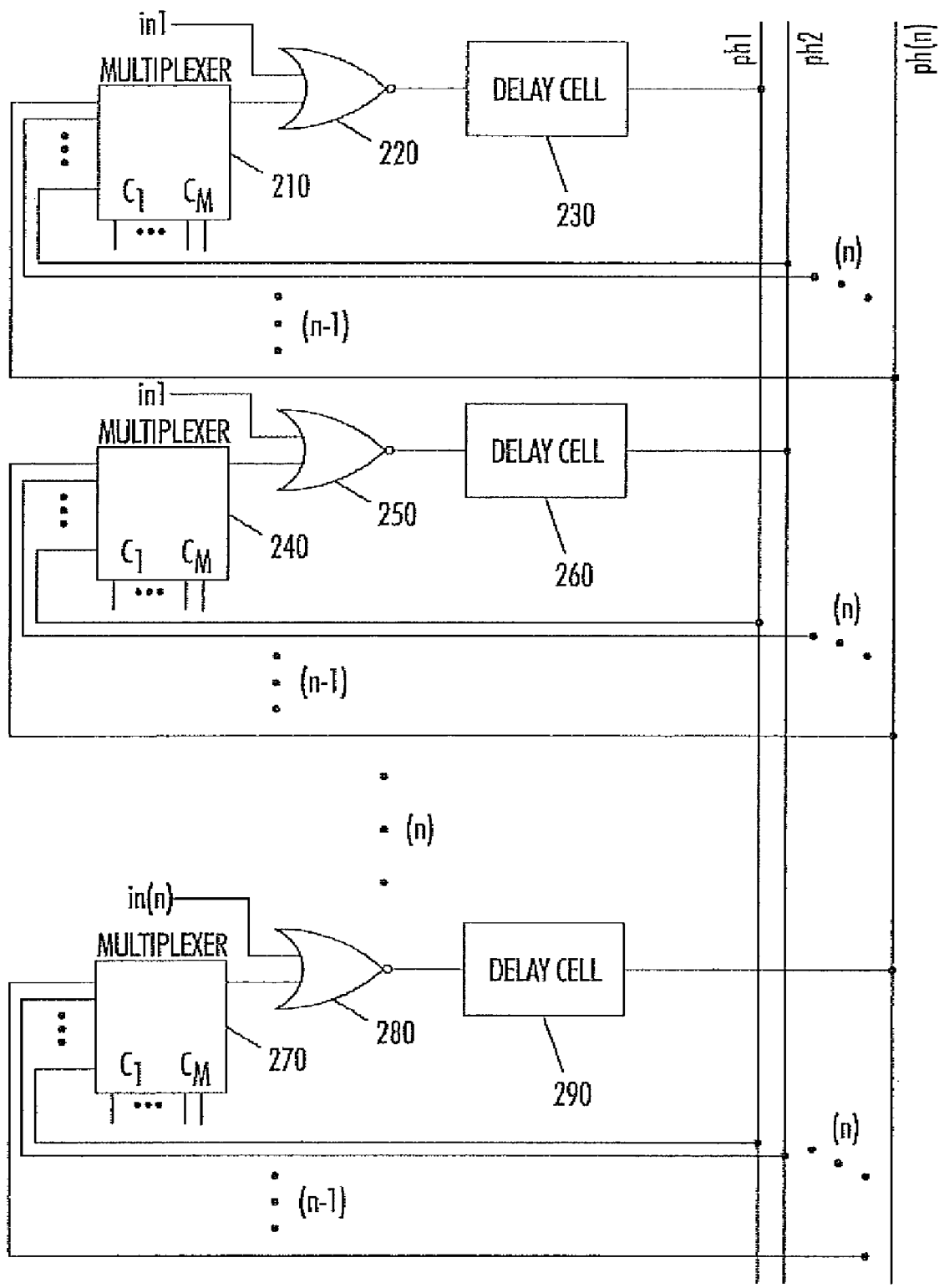
FIG. 2 illustrates a conventional circuit and method of generating non-overlapping clock signals with reference to other signals using a two-phase non-overlapping signal generator with n number of (n−1)→1 multiplexers and has a replica delay for each signal generator.

For a general understanding, reference is made to the drawings. In the drawings, like reference have been used throughout to designate identical or equivalent elements. It is also noted that the various drawings may not have been drawn to scale and that certain regions may have been purposely drawn disproportionately so that the features and concepts could be properly illustrated.

A method and apparatus generates programmable non-overlapping clock signals independent of other signals. The method and apparatus may generate programmable non-overlapping clock signals independent of other signals and also rising edge and falling edge delays independent of each other. The method and apparatus may also use a global replica delay line.

The method and apparatus may be used in analog circuits that require non-overlapping timing signals for the operation thereof. Moreover, the apparatus and methods may be used in image sensors.

FIG. 1 illustrates a system utilizing a clock driver circuit 20. The system includes a clock driver circuit 20 that is coupled to receive digital signals generated from register transfer level (RTL) code 10. The clock driver circuit 20 generates non-overlapping signals with programmable edge delay, depending on the signal, and also with programmable time delay (register programmable). These non-overlapping signals are fed to an analog domain (analog circuits) 30. It is noted that non-overlapping signals with independent delays for rising and falling edge of the signals can be generated by the clock driver circuit 20.

The clock driver circuit 20 may be used to convert signals from a digital supply rail to an analog supply rail with non-overlapping signals. More particularly, the clock driver circuit 20 may convert the digital signals, toggling between digital supply rails, one rail providing a high voltage digital supply vddd and the other rail providing a low voltage supply; e.g., a digital ground potential; to signals toggling between analog supply rails, one rail providing a high analog supply (vdda) and the other rail providing a low voltage analog supply; e.g., an analog ground potential—gnda; that can be used in analog domain. These signals have enough driving strength to drive all the connected analog circuitry.

The signals generated in the clock driver circuit 20 may drive some of the timing critical blocks of analog circuits, for example, an analog-to-digital converter or a switched capacitor analog-to-digital converter. The switched capacitor analog-to-digital converter may have multiple switches operated by timing signals to change the mode of operation of the operation amplifier used in the analog-to-digital converter. The timing sequence for these switches might result in capacitive feed through that affects the accuracy of the analog-to-digital converter. Thus, the clock driver circuit 20 may generate all the timing signals required for the analog circuits with flexibility in non-overlapping.

Figure 3:
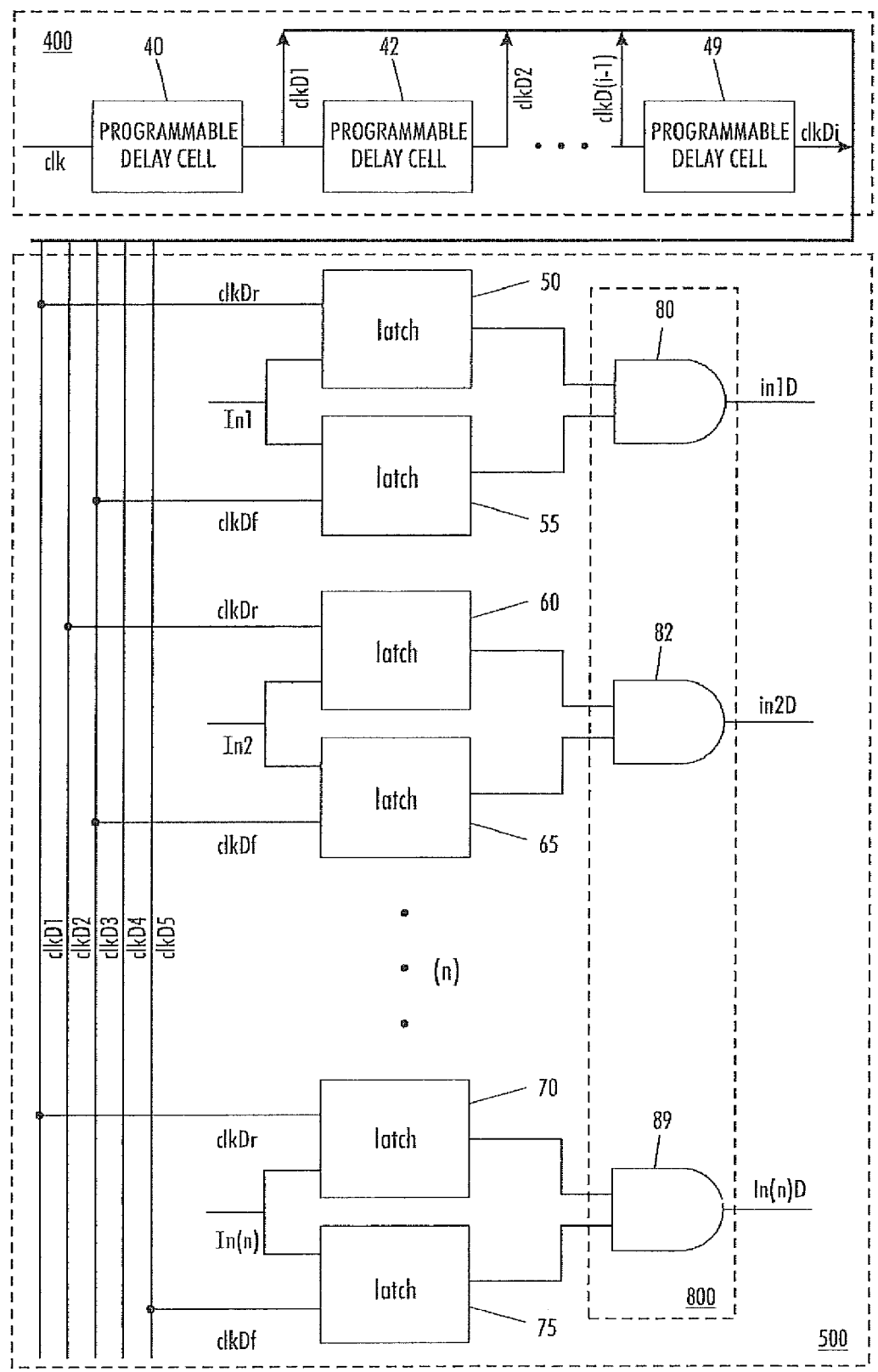
FIG. 3 illustrates an alternative circuit and method according to one embodiment of the present invention that uses programmable delayed reference clock signals and a global replica delay cell to generate the required non-overlapping signals independent of other signals.
Figure 4:
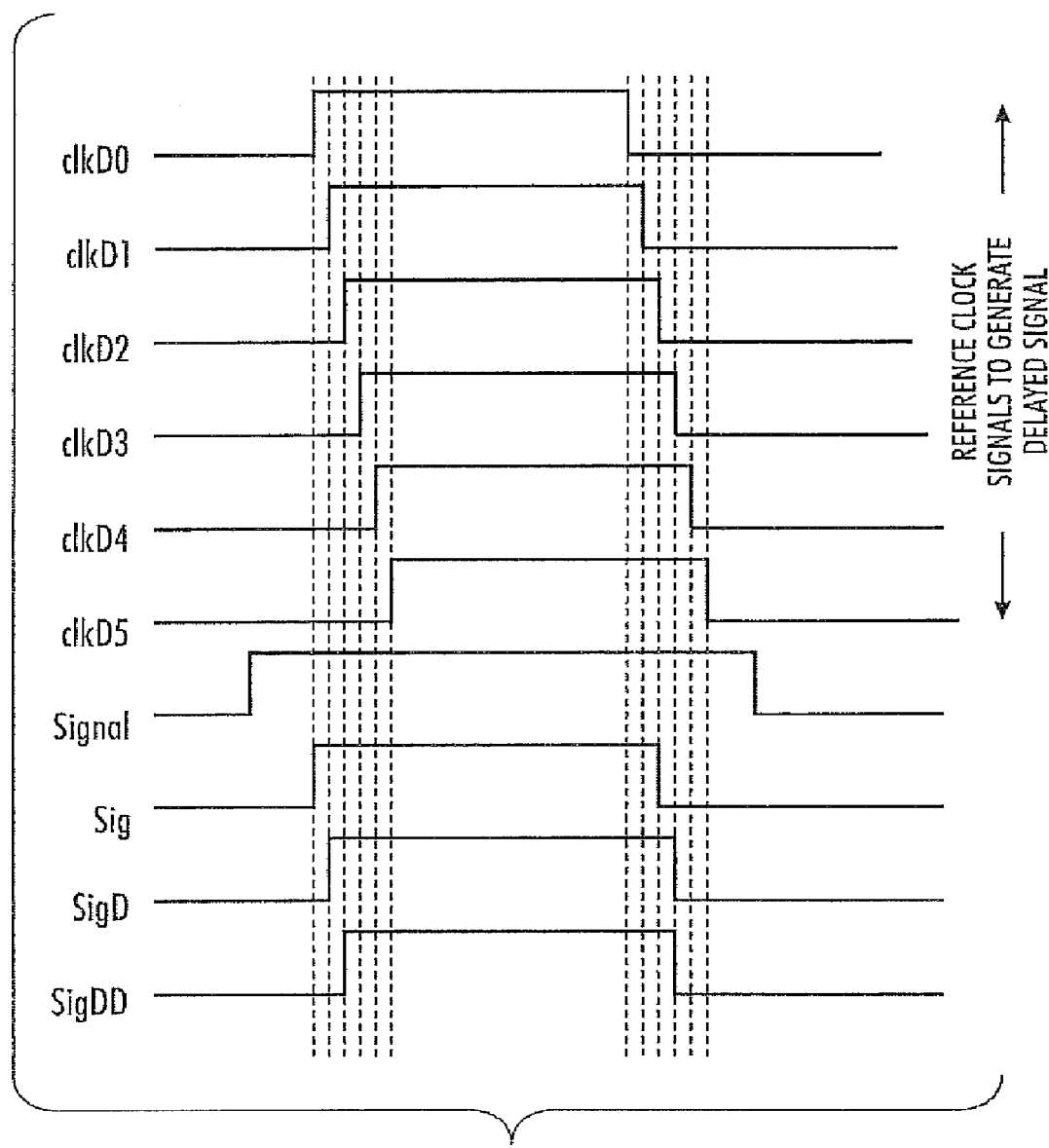
FIG. 4 illustrates the timing signals for the circuit of FIG. 3.

FIG. 3 illustrates a circuit that uses programmable delayed reference clock signals circuit 400, having programmable delay cells (40, 42, 49), and a clock signal generator 500 to generate the required non-overlapping signals. The timing signals for the circuit of FIG. 3 are illustrated in FIG. 4.

As illustrated in FIG. 3, non-overlapping output signal are generated only from the original signals and the delayed reference clock signals with no dependency on any other signals. For example, non-overlapping output signal In1D is generated from original signal In1 and delayed reference clock signals clkD1 and clkD3. It is noted that the delayed reference clock signals are programmable, as opposed to the above noted method where n (number of input signals) of (n−1)→1 multiplexers have to be used to achieve this flexibility.

As illustrated in FIG. 3, a reference clock signal clk is input to the programmable delayed reference clock signals circuit 400. The programmable delayed reference clock signals circuit 400 produces a plurality of delayed reference clock signals (clkD1, clkD2, . . . , clkD(i−1) and clkD(i)) from the reference clock signal clk using a plurality of programmable delay cells (40, 42, 49). The plurality of delayed reference clock signals (clkD1, clkD2, . . . , clkD(i−1) and clkD(i)) are input to the clock signal generator 500.

The clock signal generator 500 is constructed of a plurality of delay clock signal generators wherein each delay clock signal generator includes a pair of latches (50 & 55, 60 & 65, 70 & 75) and a logic circuit 800. As illustrated in FIG. 3, the logic circuit 800 may include AND circuits (80, 82, 89).

As illustrated in FIG. 3, a first delay clock signal generator receives a signal In1 which is input to a pair of latches (50 & 55). Latch 50 also receives the delayed reference clock signal clkD1 at input clkDr to control the delay of the rising edge of the delayed clock signal In1D, and latch 55 receives the delayed reference clock signal clkD3 at input clkDf to control the delay of the falling edge of the delayed clock signal In1D. The latches (50 & 55) output signals to a logic circuit which may include AND circuit 80 which produces delayed clock signal In1D.

A second delay clock signal generator receives a signal In2 which is input to a pair of latches (60 & 65). Latch 60 also receives the delayed reference clock signal clkD2 at input clkDr to control the delay of the rising edge of the delayed clock signal In2D, and latch 65 receives the delayed reference clock signal clkD4 at input clkDf to control the delay of the falling edge of the delayed clock signal In2D. The latches (60 & 65) output signals to a logic circuit which may include AND circuit 82 which produces delayed clock signal In2D.

A third delay clock signal generator receives a signal In(n) which is input to a pair of latches (70 & 75). Latch 70 also receives the delayed reference clock signal clkD1 at input clkDr to control the delay of the rising edge of the delayed clock signal In(n)D, and latch 75 receives the delayed reference clock signal clkD5 at input clkDf to control the delay of the falling edge of the delayed clock signal In(n)D. The latches (70 & 75) output signals to a logic circuit which may include AND circuit 89 which produces delayed clock signal In(n)D.

It is noted that the actual selection of the delayed reference clock signals used to control the delay in the rising and falling edges, independently, may be programmable such that the selection is based on predetermined criteria or user selected so as to produce the desired delay in the rising and falling edges, independently. It is further noted that the number of delayed clocks to be generated is chosen depending on the required delay for each signal. It is also noted that the latches of FIG. 3 may be edge-triggered flip-flops.

As discussed above, two of the delayed clocks are selected and latched with the original input signal. The outputs of the latches are logically combined to get a non-overlapping signal; i.e., the outputs of the latches can be AND'ed to get a non-overlapping signal. The two delayed clock signals set the rising edge and falling edge of the original signal.

For example, as illustrated in FIG. 4, if a signal Sig is required wherein the signal should have no delay in the rising edge but a two unit in the falling edge, a delay clock signal generator of FIG. 3 would have the clkDr input of a latch connected to delayed reference clock signal clkD0 and the clkDf input of a latch connected to delayed reference clock signal clkD2 such that the resulting non-overlapping clock signal, from the logical ANDing of the delayed reference clock signals, would cause signal Sig to be realized.

Moreover, as illustrated in FIG. 4, if a signal SigD is required wherein the signal should have a one unit delay in the rising edge and a three unit in the falling edge, a delay clock signal generator of FIG. 3 would have the clkDr input of a latch connected to delayed reference clock signal clkD1 and the clkDf input of a latch connected to delayed reference clock signal clkD3 such that the resulting non-overlapping clock signal, from the logical ANDing of the delayed reference clock signals, would cause signal SigD to be realized.

Also, as illustrated in FIG. 4, if a signal SigDD is required wherein the signal should have a two unit delay in the rising edge and a three unit in the falling edge, a delay clock signal generator of FIG. 3 would have the clkDr input of a latch connected to delayed reference clock signal clkD2 and the clkDf input of a latch connected to delayed reference clock signal clkD3 such that the resulting non-overlapping clock signal, from the logical ANDing of the delayed reference clock signals, would cause signal SigDD to be realized.

Also, as illustrated in FIG. 4, if a signal SigDD is required wherein the signal should have a two unit delay in the rising edge and a three unit in the falling edge, a delay clock signal generator of FIG. 3 would have the clkDr input of a latch connected to delayed reference clock signal clkD2 and the clkDf input of a latch connected to delayed reference clock signal clkD3.

In summary, a method and apparatus generates programmable non-overlapping clock signals independent of other signals. The method and apparatus may generate programmable non-overlapping clock signals independent of other signals and also rising edge and falling edge delays independent of each other.

While various examples and embodiments have been shown and described, it will be appreciated by those skilled in the art that the spirit and scope of the description are not limited to the specific description and drawings herein, but extend to various modifications and changes.

What is claimed is:

1. A circuit for generating non-overlapping clock signals, comprising:
    a programmable delayed reference clock signals circuit to produce a plurality of delayed reference clock signals; and
    a plurality of delay clock signal generators, operatively connected to said programmable delayed reference clock signals circuit, to generate non-overlapping clock signals;
    each delay clock signal generator including,
        a logic circuit to logically generate a non-overlapping clock signal from a first signal and a second signal,
        a first circuit, operatively connected to said programmable delayed reference clock signals circuit, to output said first signal, said first signal controlling a delay in a rising edge of the non-overlapping clock signal generated by said logic circuit, and
        a second circuit, operatively connected to said programmable delayed reference clock signals circuit, to output said second signal, said second signal controlling a delay in a falling edge of the non-overlapping clock signal generated by said logic circuit.

2. The circuit for generating non-overlapping clock signals as claimed in claim 1, wherein said first circuit controls a delay in the rising edge of the non-overlapping clock signal generated by said logic circuit in response to one of said plurality of delayed reference clock signals.

3. The circuit for generating non-overlapping clock signals as claimed in claim 1, wherein said second circuit controls a delay in the falling edge of the non-overlapping clock signal generated by said logic circuit in response to one of said plurality of delayed reference clock signals.

4. The circuit for generating non-overlapping clock signals as claimed in claim 1, wherein said first and second circuit are latches.

5. The circuit for generating non-overlapping clock signals as claimed in claim 1, wherein said first and second circuit are edge-triggered flip-flops.

6. The circuit for generating non-overlapping clock signals as claimed in claim 1, wherein the operable connection between said first circuit and said programmable delayed reference clock signals circuit is programmable and the operable connection between said second circuit and said programmable delayed reference clock signals circuit is programmable.

7. The circuit for generating non-overlapping clock signals as claimed in claim 1, wherein a delay in the delayed reference clock signals is programmable.

8. A circuit for generating non-overlapping clock signals, comprising:
    a programmable delayed reference clock signals circuit to produce a plurality of delayed reference clock signals; and
    a plurality of delay clock signal generators, operatively connected to said programmable delayed reference clock signals circuit to generate a plurality of non-overlapping clock signals;
    said plurality of delay clock signal generators controlling a delay in a rising edge of a non-overlapping clock signal independent of controlling a delay in a falling edge of the non-overlapping clock signal.

9. The circuit for generating non-overlapping clock signals as claimed in claim 8, wherein each delay clock signal generators includes a first latch to control a delay in a rising edge of the non-overlapping clock signal and a second latch to control a delay in a falling edge of the non-overlapping clock signal.

10. The circuit for generating non-overlapping clock signals as claimed in claim 8, wherein each delay clock signal generators includes a first edge-triggered flip-flop to control a delay in a rising edge of the non-overlapping clock signal and a second edge-triggered flip-flop to control a delay in a falling edge of the non-overlapping clock signal.

11. The circuit for generating non-overlapping clock signals as claimed in claim 9, wherein said first latch controls a delay in the rising edge of the non-overlapping clock signal in response to one of said plurality of delayed reference clock signals.

12. The circuit for generating non-overlapping clock signals as claimed in claim 9, wherein said second latch controls a delay in the falling edge of the non-overlapping clock signal in response to one of said plurality of delayed reference clock signals.

13. The circuit for generating non-overlapping clock signals as claimed in claim 11, wherein said first latch is operatively connected to said programmable delayed reference clock signals circuit, the operable connection between said first latch and said programmable delayed reference clock signals circuit being programmable.

14. The circuit for generating non-overlapping clock signals as claimed in claim 12, wherein said second latch is operatively connected to said programmable delayed reference clock signals circuit, the operable connection between said second latch and said programmable delayed reference clock signals circuit being programmable.

15. The circuit for generating non-overlapping clock signals as claimed in claim 9, wherein a delay in the delayed reference clock signals is programmable.

16. A method for generating non-overlapping clock signals, comprising:

generating a plurality of delayed reference clock signals;

generating, using the plurality of delayed reference clock signals, a plurality of non-overlapping clock signals;

controlling a delay in a rising edge of a non-overlapping clock signal based upon a first delayed reference clock signal; and controlling a delay in a falling edge of a non-overlapping clock signal based upon a second delayed reference clock signal.

17. The method as claimed in claim 16, wherein the delay in the delayed reference clock signals is programmable.

18. The method as claimed in claim 16, wherein a selection of the delayed reference clock signal used to control the delay in the rising edge of the non-overlapping clock signal is programmable.

19. The method as claimed in claim 16, wherein a selection of the delayed reference clock signal used to control the delay in the falling edge of the non-overlapping clock signal is programmable.

20. The method as claimed in claim 18, wherein a selection of the delayed reference clock signal used to control the delay in the falling edge of the non-overlapping clock signal is programmable.

* * * * *